United States Patent
Bourgin

(10) Patent No.: US 7,245,157 B2
(45) Date of Patent: Jul. 17, 2007

(54) DYNAMIC PHASE ASSIGNMENT OPTIMIZATION USING SKEWED STATIC BUFFERS IN PLACE OF DYNAMIC BUFFERS

(75) Inventor: Bernard Bourgin, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 98 days.

(21) Appl. No.: 11/015,513

(22) Filed: Dec. 17, 2004

(65) Prior Publication Data

US 2006/0132186 A1 Jun. 22, 2006

(51) Int. Cl.
*H03K 19/096* (2006.01)

(52) U.S. Cl. .............. 326/96; 326/95; 326/97

(58) Field of Classification Search ............ 326/93–98, 326/112, 119, 121
See application file for complete search history.

(56) References Cited

U.S. PATENT DOCUMENTS

| | | | |
|---|---|---|---|
| 5,041,742 A | 8/1991 | Carbonaro | |
| 5,852,373 A * | 12/1998 | Chu et al. | 326/98 |
| 5,880,608 A * | 3/1999 | Mehta et al. | 326/93 |
| 5,883,529 A | 3/1999 | Kumata et al. | |
| 5,930,148 A | 7/1999 | Bjorksten et al. | |
| 6,209,121 B1 | 3/2001 | Goto | |
| 2004/0155678 A1 | 8/2004 | Anderson et al. | |

OTHER PUBLICATIONS

D. Harris, "Skew-Tolerant Circuit Design", Morgan Kaufman Publishers, San Francisco, CA 2001, Chapter 1, pp. 1-31 and section 3.2., pp. 79-95, no month.

K. Bernstein et al. "High Speed CMOS Design Styles", Kluwer Academic Publishers, Boston, 1998, pp. 91-131, no month.

* cited by examiner

*Primary Examiner*—Anh Q. Tran
(74) *Attorney, Agent, or Firm*—Lisa K. Jorgenson; William J. Kubida

(57) ABSTRACT

A primarily domino logic block uses static buffers instead of clocked domino buffers to correct a phase skipping problem, while realizing the same logic function with less integrated circuit area, power consumption, and cost. The use of static buffers simplifies the clock network and clock tree synthesis. A domino logic circuit including at least one logic gate including a fast input and a slow input, and a static buffer inserted in series with the fast input of the logic gate. The falling time of the static buffer is set to be greater than a defined minimum falling time and less than a defined maximum falling time.

26 Claims, 2 Drawing Sheets

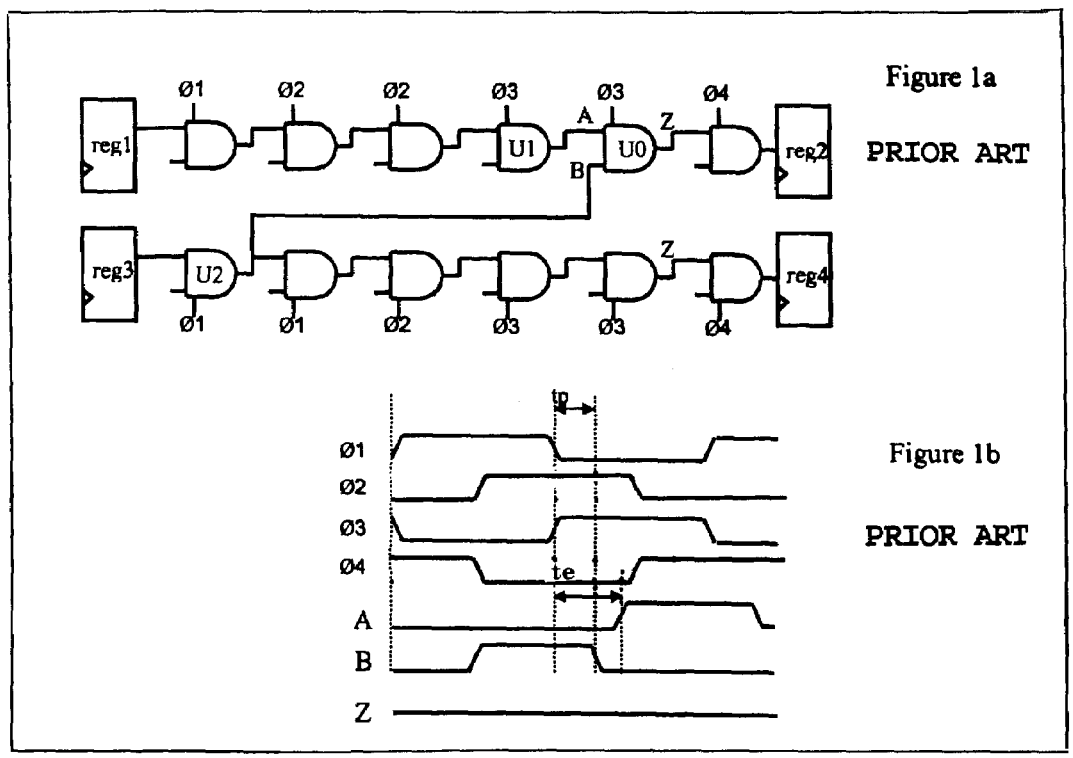
Figure 1a PRIOR ART
Figure 1b PRIOR ART
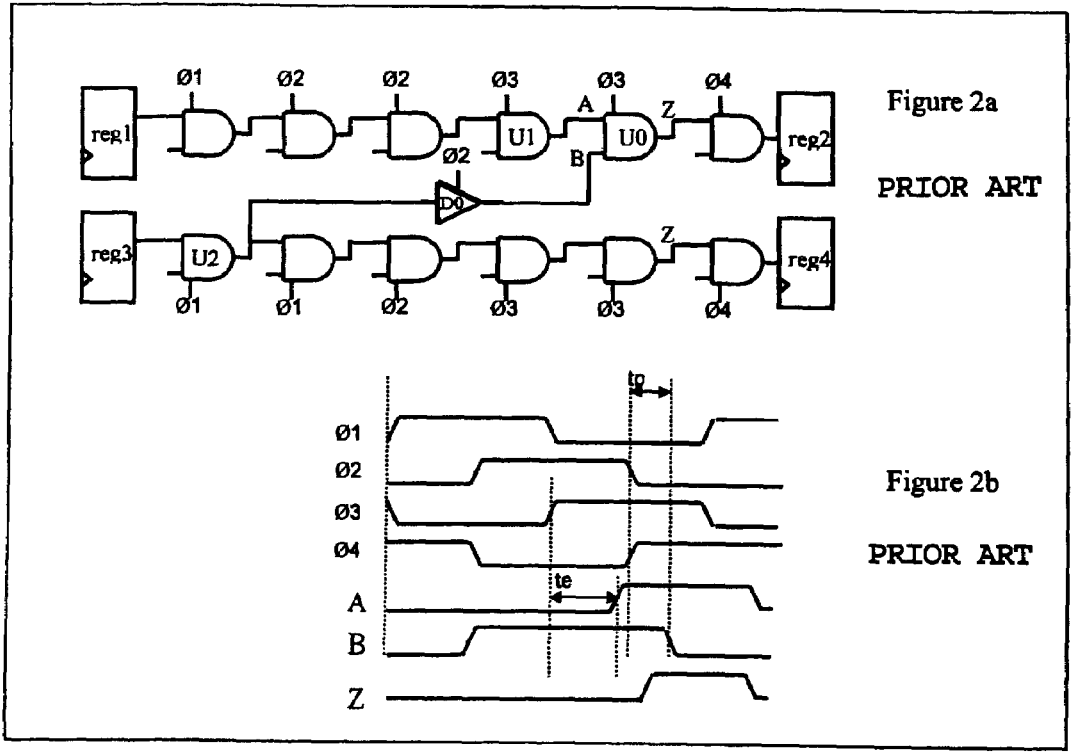
Figure 2a PRIOR ART
Figure 2b PRIOR ART

DYNAMIC PHASE ASSIGNMENT OPTIMIZATION USING SKEWED STATIC BUFFERS IN PLACE OF DYNAMIC BUFFERS

CROSS REFERENCE TO RELATED PATENT APPLICATIONS

The present invention is related to the subject matter of U.S. patent application Ser. No. 10/248,721 for: "Method for Synthesizing Domino Logic Circuits" and U.S. patent application Ser. No. 11/015,317 for: "Method And Apparatus for Mixing Static Logic With Domino Logic" and is further related to the subject matter of U.S. patent application Ser. No. 11/015,512 for: "Method To Unate A Design For Improved Synthesizable Domino Logic Flow", all of which are filed concurrently and assigned to STMicroelectronics, Inc., Carrollton, Tex. and the disclosures of which are herein specifically incorporated in their entirety by this reference.

BACKGROUND OF THE INVENTION

The present invention relates to domino logic circuits, and, more particularly, to the use of specially designed skewed static buffers in domino logic circuitry in order to avoid the loss of data in a four overlapping phase clocking scheme, wherein phase 3 is the invert of phase 1, phase 4 is the invert of phase 2, and phase 2 is a delayed version of phase 1 (usually by a quarter of a period).

As is known in the art, domino logic is a precharged, non-inverting family of CMOS logic that can be pipelined using multiple clock phases to achieve high-speed operation. Domino logic is faster than standard static logic, but it is more difficult to design because of its increased complexity, primarily in the clocking network. In addition, domino logic uses more power and more integrated circuit area than equivalent standard static logic.

In domino logic, a "precharge" clock phase is used, followed by an "evaluate" clock phase. During the precharge phase, when the clock is low, the output of the cell is preset to a low logic state (logic zero). During the evaluate phase, when the clock is high, the output of the cell either stays low or transitions to a high value on the condition that, based on the data inputs, the function of the cell evaluates a logic one value. This is in contrast to standard static logic typically used with CMOS technology. In static logic designs, the output of the cell can rise or fall any time an input changes.

As discussed above, domino logic is a pulsed logic. Within a given clock period, domino gates evaluate and then go to precharge. Therefore, it is important to make sure that the result from a gate is consumed by the next gate before going to precharge. Also, if a domino signal is logically ANDed with other domino signals, their pulsed values must overlap long enough to allow the gate to compute the correct value.

As is known in the prior art, in a four phase clocking scheme, in order to effectively propagate timing critical data in a datapath, it is important that, for each domino cell, the clock rises some time before the latest data arrives, otherwise the data has to wait and consequently the output is delayed. It is also important, for each domino cell, that the data arrives some setup time before the clock falls in order to be correctly captured. One way to initially assign the phases, as defined in the prior art, is to choose, for each domino gate, the latest phase rising immediately before the arrival of the latest data.

FIG. 1(a) shows an example of two interconnected datapaths, which have been phase assigned according to the rules mentioned above. The first datapath is from "REG1" to "REG2", and the second datapath is from "REG3" to "REG4". In the configuration shown in FIG. 1(a), the AND gate U0 on the first datapath is coupled to a domino gate U1 from the same path, clocked on phase 3 (at the slow "A" input), and to a domino gate U2 from the second datapath, clocked on phase 1 (at the fast "B" input). This situation is known in the prior art as "phase skipping". The timing diagram of FIG. 1(b) shows that the fast input goes to precharge some time ("tp") after phase 1 goes low, whereas the slow input goes high some evaluate time ("te") after phase 3 goes high. In the situation shown in FIG. 1(b), the data on the slow input arrives after the data on the fast input has been lost and therefore can never be captured by the AND gate.

To prevent this situation, the fast input B has to be delayed such that its logic one value overlaps long enough ("ov") with the logic one value on the slow input A, before going to precharge. The overlap requirement is a characteristic of the cell, under certain conditions (process, voltage, temperature, transition time on the inputs) and has been previously characterized.

In the prior art, one way of achieving this delay, as shown in FIG. 2(a), was to insert a domino buffer D0 before the fast input, and to assign this buffer to the intermediate phase (i.e. phase 2 in this example). The new arrangement shown in FIG. 2(a) modifies the timing conditions, which are shown in FIG. 2(b), since the precharge on the fast input is now relative to the falling edge of phase 2. The drawback of this prior art solution is that it adds to the clock network loading, increases power consumption and integrated circuit area, and makes clock tree synthesis more complex. The number of dynamic buffers added to a design to fix the phase skipping problems can be significant (typically adding 5% to the total number of dynamic cells).

What is desired, therefore, is a circuit and method for providing the necessary delay to satisfactorily address the phase skipping issue in a domino logic circuit, but overcoming the problems of the prior art domino buffer solution that leads to increased complexity, power consumption, and integrated circuit area.

SUMMARY OF THE INVENTION

According to an embodiment of the present invention, a circuit and method for a primarily domino logic block uses skewed static buffers instead of clocked domino buffers to correct the phase skipping problem, while realize the same logic function with less integrated circuit area, power consumption, and cost. The use of static buffers according to the present invention simplifies the clock network and clock tree synthesis.

According to an embodiment of the present invention a four phase, evenly skewed, domino logic circuit includes at least one gate including a fast input connected directly or coupled through intervening static logic to a domino gate clocked on phase N, and a slow input connected directly or through intervening static logic to a domino gate clocked on phase N+2, and a static delay cell inserted in series with the fast input of the gate. The falling time of the static buffer is greater than a predetermined minimum falling time and less than a predetermined maximum falling time. The optimum falling time of the static buffer is about ⅜ of the period of the clock signal used to clock the domino logic gate. The rising time of the static buffer is less than a predetermined maximum rising time of about ⅛ of the period of the clock signal used to clock the domino logic gate. The ratio of the falling time to the rising time of the static buffer is between two and four, with an optimum value of about three. The rising and falling times of the static buffer are adjusted according to the period of the clock signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1(a) is a logic schematic of a prior art domino logic circuit having a "phase skipping" problem;

FIG. 1(b) is a timing diagram associated with the prior art circuit of FIG. 1(a), illustrating the phase skipping problem;

FIG. 2(a) is a logic schematic of a domino logic circuit including a domino buffer to fix the phase skipping problem according to the prior art;

FIG. 2(b) is a timing diagram associated with the circuit of FIG. 2(a), illustrating that the phase skipping problem has been addressed, according to the prior art;

DETAILED DESCRIPTION

Figures 3A, 3B:
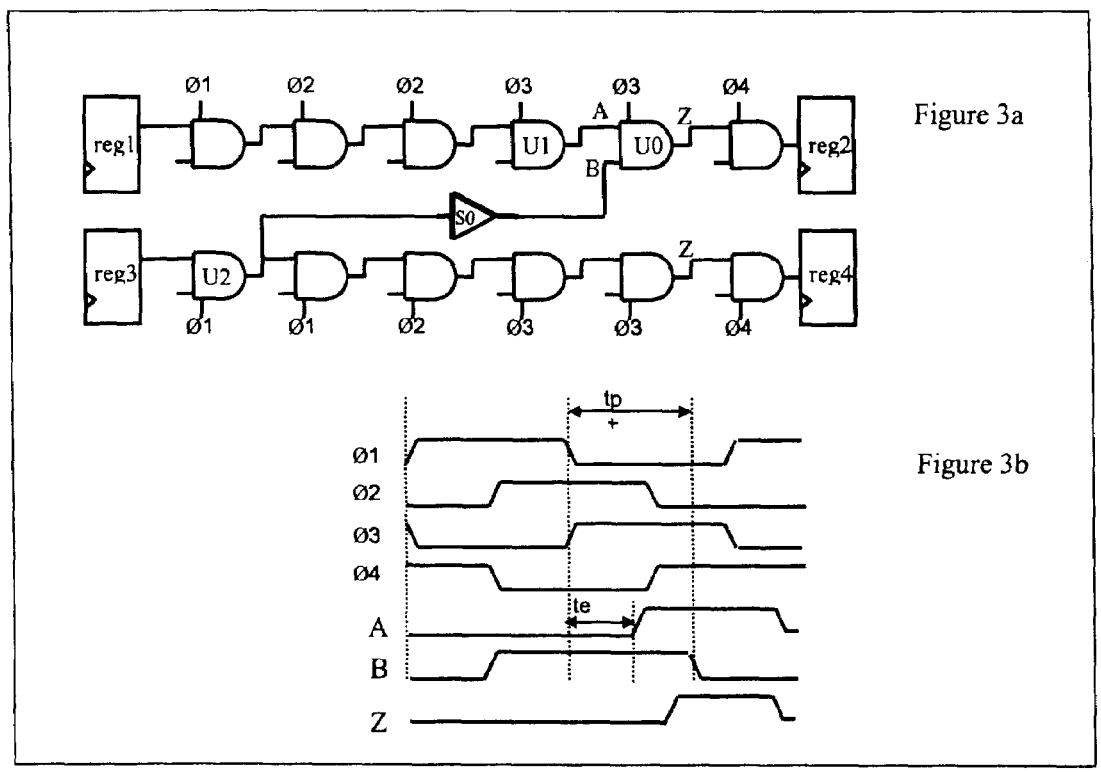
FIG. 3(a) is a logic schematic of a domino logic circuit including an unclocked static buffer according to an embodiment of the present invention.
FIG. 3(b) is a timing diagram associated with the circuit of FIG. 3(a), illustrating a sufficient delay and consequent overlap of the operand waveforms such that the phase skipping problem is solved.

The following is a description of an embodiment of the present invention for a four-phase clock scheme (phase 1 through phase 4). Although the clock signals are shown having a 50% duty cycle (i.e. each clock toggles every half period) and phase N being a copy of phase N−1 delayed by a quarter of a period, it will be apparent to those of ordinary skill in the art that the present invention can be used with more relaxed requirements regarding the phase alignment. All that is required are four skewed versions of an original clock, wherein the falling edge of phase 1 is aligned with the rising edge of phase 3, and the falling edge of phase 2 is aligned with the rising edge of phase 4 (plus or minus some controlled skew).

The present invention is used in the framework of an automated phase assignment (script), which initially assigns phases based on the worst-case data arrival time. The script assigns a cell to phase P as shown in equation [1]:

$$P=int((\text{max\_arrival\_time}-\text{clock\_skew})*4/\text{period})+1 \quad [1]$$

Wherein "max_arrival_time" is defined as the latest data arrival on the gate, "clock_skew" is defined as the maximum variation in the clock arrival time with respect to its source, and "period" is defined as the clock period.

In other words, the latest clock that rises immediately before the slowest data arrival, assuming worst case clock skew, phases each domino cell.

The present invention addresses only the situation when a cell receives different precharges on two ANDed inputs, such as the first precharge is triggered by phase N and the second precharge is triggered by phase N+2, which is by far the most common phase skipping situation (single phase skipping).

FIGS. 1(a)/1(b) show a worst-case scenario, where a late cell U0 on phase 3 is directly driven by a cell U2 on phase 1 and a cell U1 on phase 3. Indeed, if the cell on phase 3 was not so late or if one or more static cells were inserted between U2 and U0, the timing situation would be improved.

Based on the phase assignment scheme described above, if "tpmin" is defined as the fastest precharge time in the domino library, the earliest the data goes to precharge on U0/B is given in equation [2]:

$$tf=\text{period}/2-\text{skew}+t\text{pmin} \quad [2]$$

Wherein skew is the worst-case inter-clock skew.

Similarly, the latest U0/A rises is given in equation [3]:

$$tr=3*\text{period}/4+\text{skew}/2 \quad [3]$$

Consequently the high overlap "ov" between U0/A and U0/B is given in equation [4]:

$$ov=tf-tr=t\text{pmin}-(\text{period}/4+1.5*\text{skew}) \quad [4]$$

The above equations describe a single phase skipping between phase 1 and phase 3, as shown in the example. Similar equations can be written for any single phase skipping situation (from phase 2 to phase 4, or from phase 3 to phase 1). The worst-case situation occurs in the worst process/temperature/voltage corner. Common values for the above parameters (for 0.13 μm technology and below) are: tpmin~110 ps, skew~100 ps, period>1 ns. Therefore "ov" is by far negative, whereas typical requirements for the overlap are in the order of 100 ps to 200 ps.

Transforming previous equation [4] tpmin is given in equation [5] as follows:

$$t\text{pmin}=ov+\text{period}/4+1.5*\text{skew} \quad [5]$$

Equation [5] thus describes the minimum requirement for "tp" (precharge time).

A few other requirements are related to the precharge time of domino logic cells.

The maximum value for any cell precharge is defined by equation [6]:

$$t\text{pmax}=\text{period}/2-jit-\text{setup} \quad [6]$$

Wherein "jit" is the phase duty cycle jitter (the sum of the PLL duty cycle jitter, the clock tree skew and on-chip process variations) and "setup" is the time the precharge must arrive before the beginning of the next cycle in order to avoid a data shoot-through when two domino cells on the same phase are connected together. At high speed (1 GHz), in order to satisfy the overlap requirement in the case of a direct connection, the precharge time of the domino cell (U2 in the example) has to be on the order of 550 ps [5]. However, the maximum precharge time allowed is on the order of 300 ps [6]. Therefore, a single cell precharge time does not fix the phase skipping problem described above.

The traditional solution for addressing the phase skipping problem is to insert a domino buffer on phase 2, which delays the precharge by period/4. In this case, there is a new minimum precharge requirement of: ov+1.5*skew. Once again, at high frequency, depending on the skew budget, this value can be very close to "tpmax" and therefore not achievable, given the value variation for precharge delays with respect to clock input transition and the output load of the cell.

According to an embodiment of the present invention, the required delay to address the phase skipping problem is provided by a static buffer, which is usually smaller (less design perturbation during an ECO ("engineering change order")) and consumes less power. The timing requirement for the static buffer according to an embodiment of the present invention is to delay the precharge long enough to meet the overlap requirement.

The falling time requirement for the static buffer is given in equation [7]:

$$tfmin > period/4 - tpmin + ov + 1.5*skew \quad [7]$$

The maximum requirement for the falling time is given in equation [8]:

$$tfmax < period - skew - setup - tpmax \quad [8]$$

Given the parameter values specified above, and targeting a clock frequency ranging from 500 MHz to 1 GHz in the worst case process, temperature, and voltage, an optimum value for "tf" is about 3*period/8.

Another requirement, which is that the static buffer does not delay the evaluation path to U0, must be verified. This means that U0/B must arrive not later than U0/A.

The minimum arrival time on U0/A is given in equation [9]:

$$tAmin = period/2 \quad [9]$$

The maximum arrival time on U0/B is given in equation [10]:

tBmax=period/4+skew+temax+trmax, where "temax" is the maximum evaluation time for U2 and "trmax" is the maximum rising time for the inserted static buffer.

So, for tAmin≧tBmax, and substituting terms, equation [11] holds that:

$$period/2 \geq period/4 + skew + temax + trmax \quad [11]$$

Simplifying equation [11] produces equation [12] as follows:

$$trmax < period/4 - skew - temax \quad [12]$$

The above equation [12] shows that at high frequency (1 GHz) it is extremely important to control the inter-clock skew and "temax" in order to provide a reasonable "trmax". Usually, an optimum target for "trmax" is below period/8.

In conclusion, the inserted static buffer has to have a skewed propagation time with a falling/rising ratio between two and four (typically three). The rising and falling time requirements must be valid across various input transitions and output loads, hence a family of drives has to be developed for a given clock period target. Then, in order to cover a reasonable range of clock periods, a number of families of drives have to be developed, targeting a number of clock points within the clock spectrum. As an example: a clock period between 1 ns to 2 ns clock with a 200 ps increment gives a good overlap between the families.

While there have been described above the principles of the present invention in conjunction with a preferred embodiment thereof, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A logic circuit comprising:
    a domino logic circuit using a multiple clock scheme including at least one logic gate including a fast input being pre-charged by a first phase and a slow input being pre-charged by a second phase; and
    a skewed logic static buffer inserted in series with the fast input of the logic gate.

2. The logic circuit of claim 1 wherein a falling time of the static buffer is greater than a predetermined minimum falling time.

3. The logic circuit of claim 1 wherein a falling time of the static buffer is less than a predetermined maximum falling time.

4. The logic circuit of claim 1 wherein a falling time of the static buffer has an optimum falling time of about 3/8 of the period of a clock signal used to clock domino gates in the domino logic circuit.

5. The logic circuit of claim 1 wherein a rising time of the static buffer is less than a predetermined maximum rising time.

6. The logic circuit of claim 5 wherein the predetermined maximum rising time is about 1/8 of a period of a clock signal used to clock the domino logic gate.

7. The logic circuit of claim 1 wherein a ratio of a falling time to a rising time of the static buffer is between two and four.

8. The logic circuit of claim 1 wherein a ratio of a falling time to a rising time of the static buffer is about three.

9. The logic circuit of claim 1 wherein a rising time of the static buffer is adjusted according to the period of a clock signal used to clock the logic gate.

10. The logic circuit of claim 1 wherein a falling time of the static buffer is adjusted according to the period of a clock signal used to clock the logic gate.

11. The logic circuit of claim 1 wherein the multiple clock scheme comprises a four overlapping clock scheme.

12. The logic circuit of claim 1 wherein the first phase comprises phase N.

13. The logic circuit of claim 1 wherein the second phase comprises phase N+2.

14. A method of fixing a phase skipping problem in a domino logic circuit comprising:
    providing a domino logic circuit including at least one logic gate including a fast input pre-charged by a first phase and a slow input pre-charged by a second phase; and
    inserting a skewed logic static buffer in series with the fast input of the logic gate.

15. The method of claim 14 further comprising setting a falling time of the static buffer to be greater than a predetermined minimum falling time.

16. The method of claim 14 further comprising setting a falling time of the static buffer to be less than a predetermined maximum falling time.

17. The method of claim 14 further comprising setting a falling time of the static buffer to be an optimum falling time of about 3/8 of the period of a clock signal used to clock domino gates in the domino logic circuit.

18. The method of claim 14 further comprising setting a rising time of the static buffer to be less than a predetermined maximum rising time.

19. The method of claim 18 wherein the predetermined maximum rising time is about 1/8 of a period of a clock signal used to clock the logic gate.

20. The method of claim 14 further comprising setting a ratio of a falling time to a rising time of the static buffer to be between two and four.

21. The method of claim 14 further comprising setting a ratio of a falling time to a rising time of the static buffer to be about three.

22. The method of claim 14 further comprising adjusting a rising time of the static buffer according to the period of a clock signal used to clock the logic gate.

23. The method of claim 14 further comprising adjusting a falling time of the static buffer according to the period of a clock signal used to clock the domino logic gate.

24. The method of claim 14 further comprising providing a four overlapping clock scheme for the domino logic circuit.

25. The method of claim 14 wherein the first phase comprises phase N.

26. The method of claim 14 wherein the second phase comprises phase N+2.

* * * * *